(12) United States Patent
Matsuda et al.

(10) Patent No.: US 8,722,199 B2
(45) Date of Patent: May 13, 2014

(54) ELECTRODEPOSITED COPPER FOIL, ITS MANUFACTURING METHOD, SURFACE-TREATED ELECTRODEPOSITED COPPER FOIL USING THE ELECTRODEPOSITED COPPER FOIL, AND COPPER-CLAD LAMINATE AND PRINTED WIRING BOARD USING THE SURFACE-TREATED ELECTRODEPOSITED COPPER FOIL

(75) Inventors: Mitsuyoshi Matsuda, Saitama (JP); Hisao Sakai, Saitama (JP); Sakiko Tomonaga, Tokyo (JP); Makoto Dobashi, Saitama (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 767 days.

(21) Appl. No.: 11/910,050

(22) PCT Filed: Mar. 31, 2006

(86) PCT No.: PCT/JP2006/306920
§ 371 (c)(1),
(2), (4) Date: Jun. 15, 2009

(87) PCT Pub. No.: WO2006/106956
PCT Pub. Date: Oct. 12, 2006

(65) Prior Publication Data
US 2010/0038115 A1 Feb. 18, 2010

(30) Foreign Application Priority Data

Mar. 31, 2005 (JP) .................................. 2005-104540
Jan. 17, 2006 (JP) .................................. 2006-009321

(51) Int. Cl.
*B32B 3/00* (2006.01)
(52) U.S. Cl.
USPC ........... 428/612; 428/609; 428/671; 428/674; 428/687; 428/209; 428/450; 205/291; 205/319
(58) Field of Classification Search
USPC ......... 428/612, 615, 609, 671, 674, 687, 209, 428/450; 205/291, 319
See application file for complete search history.

(56) References Cited

U.S. PATENT DOCUMENTS

| 5,482,784 A * | 1/1996 | Ohara et al. ................ 428/607 |
| 5,834,140 A | 11/1998 | Wolski et al. |
| 6,194,056 B1 * | 2/2001 | Sakai et al. .................... 428/209 |
| 6,649,274 B1 * | 11/2003 | Taenaka et al. ............... 428/457 |
| 6,652,725 B2 * | 11/2003 | Taniguchi et al. ............. 205/50 |
| 2001/0042686 A1 | 11/2001 | Taniguchi et al. |
| 2003/0148136 A1 | 8/2003 | Yamamoto et al. |
| 2004/0104117 A1 | 6/2004 | Yang et al. |
| 2004/0110015 A1 | 6/2004 | Narui et al. |
| 2004/0163842 A1 | 8/2004 | Okada et al. |
| 2005/0045486 A1 | 3/2005 | Sahoda et al. |
| 2006/0191798 A1 | 8/2006 | Sano et al. |
| 2010/0316884 A1 | 12/2010 | Narui et al. |

FOREIGN PATENT DOCUMENTS

| EP | 1876266 | 1/2008 |
| JP | 9-143785 | 6/1997 |
| JP | 2001-329390 | 11/2001 |
| JP | 2004-035918 | 2/2004 |
| JP | 2004-162172 | 6/2004 |
| JP | 2004-263289 | 9/2004 |
| JP | 2005-029818 | 2/2005 |
| JP | 2005-159239 | 6/2005 |

OTHER PUBLICATIONS

English Language Abstract of JP 9-143785.
English Language Abstract of JP 2004-035918.
English Language Abstract of JP 2004-162172.
English Language Abstract of JP 2001-329390.
English Language Abstract of JP 2005-159239.
English Language Abstract of JP 2005-029818.
English Language Abstract of JP 2004-263289.

* cited by examiner

*Primary Examiner* — Cathy Lam
(74) *Attorney, Agent, or Firm* — Greenblum & Bernstein, P.L.C.

(57) ABSTRACT

It is an object of the present invention to provide an electrodeposited copper foil which has a lower profile and a higher gloss than low-profile electrodeposited copper foil conventionally supplied in markets. For achieving this object, the present invention employs an electrodeposited copper foil which has a super low profile, the surface roughness (Rzjis) of the deposit side of lower than 1.0-micron meter, and the gloss [Gs(60-deg.)] thereof of not lower than 400 irrespective to its thickness. The present invention also provides a manufacturing method of an electrodeposited copper foil obtained by electrodeposition using a sulfuric acid base copper electrolytic solution obtained by adding 3-mercapto-1-propanesulfonic acid and/or bis(3-sulfopropyl)disulfide, a quaternary ammonium salt polymer having a cyclic structure, and chlorine.

15 Claims, 1 Drawing Sheet

ELECTRODEPOSITED COPPER FOIL, ITS MANUFACTURING METHOD, SURFACE-TREATED ELECTRODEPOSITED COPPER FOIL USING THE ELECTRODEPOSITED COPPER FOIL, AND COPPER-CLAD LAMINATE AND PRINTED WIRING BOARD USING THE SURFACE-TREATED ELECTRODEPOSITED COPPER FOIL

FIELD OF THE INVENTION

The present invention relates to an electrodeposited copper foil, a surface-treated electrodeposited copper foil, a manufacturing method of an electrodeposited copper foil, and a copper-clad laminate and a printed wiring board using the surface-treated electrodeposited copper foil. Particularly, the present invention relates to an electrodeposited copper foil of which the bonding surface to an insulating layer-forming material has a low profile and a high gloss.

DESCRIPTION OF THE RELATED ART

Since metal copper is a good electric conductor, relatively inexpensive, and easy to handling, electrodeposited copper foils are widely used as a basic material of printed wiring boards. For electronic and electric devices which use printed wiring boards so much, the so-called down sizing such as smaller size with lighter weight is demanded. Conventionally, for achieving the down sizing of such electronic and electric devices, the wiring of signal circuits is needed to be made of a finest possible pitch, and the manufacturers have handled it by shortening the set time of over-etching and improving the etching factor of the formed wiring when employing thin copper foils and forming the wiring by etching.

Further, for electronic and electric devices reduced in size and weight, the high-performance is also simultaneously demanded. Therefore, for securing a largest possible component mounting area in a limited board area accompanying the spread of the surface mount system, keeping up with the favorable etching factor of wiring of printed wiring boards has been necessary. For the purpose, an electrodeposited copper foil having a lower profile than for ordinary printed wiring board applications has been demanded especially for tape automated bonding (TAB) boards and chip on film (COF) boards as so-called interposer boards on which IC chips, etc. are directly mounted. Here, "profile" is specified by a value obtained by measuring a surface roughness Rzjis of a bonding surface, which is the laminating interface with an insulating layer-forming material in the specification for copper foil for a printed wiring boards (hereinafter in the present application, "laminating interface" is not used, and unified into and referred to as "bonding surface"), in the TD according to JIS B 0601-2001, and "low-profile" means having a low surface roughness Rzjis of a bonding surface.

For solving such problems, Patent Document 1 discloses a surface-treated electrodeposited copper foil characterized in that the deposit side of an untreated electrodeposited copper foil having a surface roughness Rz of equal to or lower than that of the shiny side of the untreated electrodeposited copper foil is roughened, and made to be the bonding surface. In manufacturing the untreated electrodeposited copper foil, an electrolytic solution added with a compound having a mercapto group, a chloride ion, a low molecular weight glue having a molecular weight of not more than 10,000 and a macromolecular polysaccharide is used. Specifically, the compound having a mercapto group is 3-mercapto-1-propanesulfonate; the molecular weight of the low molecular weight glue is not more than 3,000; and the macromolecular polysaccharide is a hydroxyethylcellulose.

Patent Document 2 discloses a manufacturing method of an electrodeposited copper foil characterized in that, in the manufacturing method of the electrodeposited copper foil by the electrolysis of a sulfuric acid base copper electrolytic solution, the sulfuric acid base copper electrolytic solution containing a copolymer of diallyldialkylammonium salt and sulfur dioxide is used. It is contended that the sulfuric acid base copper electrolytic solution preferably contains a polyethylene glycol, chlorine and 3-mercapto-1-sulfonic acid, and that the deposit side to be bonded to an insulating base material has a low surface roughness, and provides a low profile of 1.0-micron meter±0.5-micron meter in ten-point average roughness Rz for an electrodeposited copper foil of 10-micron meter in thickness.

If an electrodeposited copper foil is manufactured using these manufacturing methods, a deposit side having a low profile is surely formed, and the foil has favorable characteristics for a conventional low-profile electrodeposited copper foil.

Patent Document 1: Japanese Patent Laid-Open No. 9-143785
Patent Document 2: Japanese Patent Laid-Open No.

DISCLOSURE OF THE INVENTION

Problems to be Solved

In addition, the clock frequency of personal computers representing electronic and electric devices rises, and the operation speed becomes remarkably fast. Computers do not only have simply a conventional intrinsic role of data processing but also have functions of using the computers themselves similarly to AV devices. Specifically, not only the music playing, but DVD pictures recording with playing, TV pictures receiving/recording/playing, TV phone, etc. are being added one after another.

That monitors of personal computers only simply satisfy a data monitoring function is insufficient, and the picture quality enough endurable to a long time viewing even if pictures like movie pictures are displayed is demanded. Inexpensive and much supply of monitors of such a quality are required. As such current monitors, liquid crystal monitors are much used. For mounting driver elements of the liquid crystal panels, the above-mentioned tape automated bonding (TAB) boards and chip on film (COF) boards are commonly used. For achieving the high-definition of monitors, formation of a finer circuit also on the driver boards comes to be required so as to correspond to the increase in the number of scanning lines. With upsizing panels, attempts are made to suppress the product dimension by narrowest possible widths of the outer periphery. Since for arranging drivers on a rear surface, a TAB board or COF board must be folded and installed, the board is demanded to have a favorable flexibility from the first. COF, different from TAB, has fined lead parts for bonding lined with a film. Therefore, it has a disadvantage in the flexibility in comparison with TAB, which has no film, so use of a more flexible material than conventional ones is effective for preventing wire breaking.

In addition, in electronic circuits for automotive use, accompanying the spreading of hybridization and the development of fuel cell cars, the circuit has no choice but to respond to big electric currents. Despite that the necessitated thickness of conductors for automotive use is presumed to exceed 200-micron meter even in future, they are used as flexible wiring boards from the viewpoint of space saving. For applying such a thick copper foil to flexible boards, the bonding surface roughness of the copper foil is essentially low, and even a rolled copper foil is being studied in view that conventional electrodeposited copper foils cannot respond. This is because in the case of conventional electrodeposited copper foils, the thicker foil has the rougher bonding surface.

In the case of using copper foils as negative electrode current collectors for lithium ion batteries, the copper foils having the smooth surface are preferably used. Specifically, for applying slurry containing an active substance on a copper foil in a uniform coating thickness when the active substance is applied on the copper foil, use of a copper foil having the smooth surface as the current collector is advantageous. Since the negative electrode active substance repeats expansion and contraction at the time of charge and discharge, the dimensional change of the copper foil as the current collecting material is large, and the copper foil expansion/contraction behavior cannot follow the current collector expansion/contraction, whereby a phenomenon of the breakage thereof occurs. Therefore, mechanical properties of copper foil as current collecting material, for bearing the repeated expansion/contraction behavior, are required to have a favorable balance between the tensile strength and elongation. Further, also when a dielectric layer for a capacitor is formed on a copper foil by the sol-gel method, use of a copper foil having the smooth surface is similarly advantageous.

As described above, the market of the electrodeposited copper foils have been spread out from printed wiring board applications. Consequently, it has been clear that there exists the request for an electrodeposited copper foil which has a lower profile in the thickness of not more than 450-micron meter, and also a better flexibility, compared with low-profile electrodeposited copper foils for printed wiring board applications conventionally supplied in the market.

SUMMARY OF THE INVENTION

As a result of extensive studies from the above-mentioned background, the present inventors have acquired an idea of a low-profile electrodeposited copper foil which is as productive as electrodeposited copper foils by conventional production methods, and shows good performance at a maximum thickness exceeding 450-micron meter.

The electrodeposited copper foil according to the present invention: the present invention is to provide an electrodeposited copper foil characterized in that the surface roughness (Rzjis) of the deposit side is lower than 1.0-micron meter, and the gloss [Gs(60-deg.)] thereof is not lower than 400.

In the electrodeposited copper foil according to the present invention, the above-mentioned gloss [Gs(60-deg.)] of the deposit side has a ratio of the TD gloss measured in the transverse direction to the MD gloss measured in the machine direction [TD gloss/MD gloss] of preferably 0.9 to 1.1.

In the electrodeposited copper foil according to the present invention, the deposit side preferably has a relationship of gloss [Gs(20-deg.)]>gloss [Gs(60-deg.)].

Further, in the electrodeposited copper foil according to the present invention, the shiny side preferably has a surface roughness (Rzjis) of lower than 2.0-micron meter, and gloss [Gs(60-deg.)] of not lower than 70.

From the viewpoint of mechanical properties of the electrodeposited copper foil according to the present invention, the electrodeposited copper foil exhibits the mechanical properties of a tensile strength of not less than 33 kgf/mm$^2$ and an elongation of not less than 5% for as received.

The electrodeposited copper foil according to the present invention exhibits the mechanical properties of a tensile strength after heating (180° C.×60 min, in the air) of not less than 30 kgf/mm$^2$ and an elongation after heating (180° C.×60 min, in the air) of not less than 8%.

The surface-treated electrodeposited copper foil according to the present invention: the surface-treated electrodeposited copper foil according to the present invention is obtained by subjecting at least one selected from rustproofing treatment and silane coupling agent treatment on a surface of the electrodeposited copper foil.

The bonding surface to an insulating layer-forming material of the surface-treated electrodeposited copper foil according to the present invention preferably has a surface roughness (Rzjis) of not more than 1.5-micron meter.

The bonding surface to an insulating layer-forming material of the surface-treated electrodeposited copper foil according to the present invention preferably has a gloss [Gs(60-deg.)] of not lower than 250.

Further, in the surface-treated electrodeposited copper foil according to the present invention, the bonding surface to an insulating layer-forming material of the surface-treated electrodeposited copper foil is also preferably roughened.

As the bonding surface to an insulating layer-forming material of the surface-treated electrodeposited copper foil according to the present invention, the deposit side of the electrodeposited copper foil is preferably used.

The manufacturing method of the electrodeposited copper foil according to the present invention: the manufacturing method of the electrodeposited copper foil according to the present invention is a method for manufacturing an electrodeposited copper foil in which the copper deposited on a cathode surface by the electrolysis method using a sulfuric acid base copper electrolytic solution is peeled off, and is characterized in that the sulfuric acid copper electrolytic solution contains, at least one selected from 3-mercapto-1-propanesulfonic acid (hereinafter in the present application, referred to as "MPS") or bis(3-sulfopropyl)disulfide (hereinafter in the present application, referred to as "SPS"), a quaternary ammonium salt polymer having a cyclic structure, and chlorine.

The total concentration of MPS and/or SPS in the sulfuric acid base copper electrolytic solution is preferably 0.5 ppm to 100 ppm.

The concentration of the quaternary ammonium salt polymer having a cyclic structure in the sulfuric acid base copper electrolytic solution is preferably 1 ppm to 150 ppm.

As the quaternary ammonium salt polymer having a cyclic structure, a diallyldimethylammonium chloride (hereinafter in the present application, referred to as "DDAC") polymer is especially preferably used.

Further, the chloride concentration in the sulfuric acid base copper electrolytic solution is preferably 5 ppm to 120 ppm.

The present invention provides an electrodeposited copper foil manufactured by the above-mentioned manufacturing method.

The copper-clad laminate according to the present invention: The copper-clad laminate according to the present invention is obtained by laminating the above-mentioned surface-treated electrodeposited copper foil and an insulating layer-forming material. When the insulating layer-forming material constituting the copper-clad laminate according to the present invention contains a skeletal material, the copper-clad laminate becomes a rigid copper-clad laminate. By contrast, when the insulating layer-forming material constituting the copper-clad laminate according to the present invention is a flexible material, the copper-clad laminate becomes a flexible copper-clad laminate.

The printed wiring board according to the present invention: by using the surface-treated electrodeposited copper foil according to the present invention, a copper-clad laminate is obtained. By subjecting the copper-clad laminate to an etching process, the printed wiring board according to the present invention is obtained. Namely, by using the above-mentioned rigid copper-clad laminate, a rigid printed wiring board is obtained. By using the above-mentioned flexible copper-clad laminate, a flexible printed wiring board is obtained.

ADVANTAGE OF THE INVENTION

The electrodeposited copper foil according to the present invention has a better low profile property in comparison with low-profile electrodeposited copper foils conventionally supplied in the market. Consequently, the electrodeposited copper foil according to the present invention has an excellent gloss exceeding conventional low-profile electrodeposited copper foils. Moreover, the electrodeposited copper foil according to the present invention shows excellent performance in low profile when the thickness of the electrodeposited copper foil goes up. Such a tendency that thicker (copper) foil shows higher surface roughness is a contrary property in conventional electrodeposited copper foils.

When the electrodeposited copper foil is actually supplied to the market, various surface treatments are performed to prevent the oxidization in the air and improve the adhesion with a base material, and the electrodeposited copper foil is generally supplied as a surface-treated electrodeposited copper foil. Use of the electrodeposited copper foil according to the present invention allows low profiling exceeding commercially available low-profile electrodeposited copper foils having been subjected to a surface treatment even if the surface treatment is performed, as long as the surface treatment is appropriately performed.

Accordingly, use of the surface-treated electrodeposited copper foil according to the present invention for a copper-clad laminate provides an excellent thickness uniformity of an insulating layer located between conductor layers formed of the surface-treated electrodeposited copper foils according to the present invention, and remarkably improves the interlayer insulation reliability causing no short-circuit even if a thin insulating layer is used. Especially when a uniform roughening treatment is performed, the copper foil becomes suitable for a copper-clad laminate for high frequencies applications.

Further, a printed wiring board obtained by using the copper-clad laminate according to the present invention and subjecting it to an etching process, since the surface-treated electrodeposited copper foil according to the present invention used for the copper-clad laminate can be low-profile, is suitable for forming a fine-pitch circuit.

DETAILED DESCRIPTION OF THE PREFERRED EMBODIMENTS

[Embodiments of the Electrodeposited Copper Foil According to the Present Invention]

Before describing the electrodeposited copper foil according to the present invention, manufacturing methods of general electrodeposited copper foils will be described for the sake of easy understanding of the description. "An electrodeposited copper foil" according to the present invention is one which has not been subjected to any surface treatment, and is sometimes referred to as "an untreated copper foil", "a drum foil", etc. In the present specification, it is simply referred to as "an electrodeposited copper foil". Manufacture of the electrodeposited copper foil generally employs the continuous production method, wherein a sulfuric acid base copper electrolytic solution is made to flow between a rotating cathode in a drum-shape and a lead-based anode or dimensionally stable anode (DSA) which is arranged along and faces on the shape of the rotating cathode; copper is deposited on the surface of the rotating cathode by utilizing the electrolysis reaction; and the deposited copper is continuously peeled off in a foil state from the rotating cathode and wound up. Since the electrodeposited copper foil thus obtained assumes a roll shape wound up in a certain width, for denoting the direction in measuring physical properties and the like, the direction of the foil same with the cathode rotation is referred to as MD (Machine Direction), and the transverse direction, which is the perpendicular direction to MD, is referred to as TD (Transverse Direction).

The surface shape of the electrodeposited copper foil on the side thereof peeled off from the contact state with the rotating cathode assumes a shape formed by transfer of the shape of the rotating cathode surface which has been subjected to a polishing treatment, and has a gloss, so this surface is referred to as "shiny side". On the other hand, the surface shape on the deposited side generally assumes an angular and irregular shape because crystal growth rates of deposited copper are generally different for every crystalline plane, so this side is referred to as "deposit side". The roughness of the deposit side is generally higher than that of the shiny side, and in subjecting an electrodeposited copper foil to a surface treatment, the deposit side is more often roughened. This deposit side performs the bonding surface to an insulating layer-forming material in manufacturing a copper-clad laminate. Therefore, the lower surface roughness of this bonding surface provides a more excellent low-profile surface-treated electrodeposited copper foil.

Although electrodeposited copper foils delivered to the market are finished by performing surface treatment, a roughening treatment to reinforce bonding to insulating layer-forming materials by a mechanical anchor effect and a rust-proofing. But they are sometimes used without the roughening treatment depending on applications. Hereinafter, the electrodeposited copper foil according to the present invention will be described.

The electrodeposited copper foil according to the present invention has a surface roughness (Rzjis) of the deposit side of lower than 1.0-micron meter and a gloss [Gs(60-deg.)] thereof of not lower than 400. More preferably, the surface roughness (Rzjis) is lower than 0.6-micron meter, and the gloss [Gs(60-deg.)] is not lower than 600. First, gloss will be described. The gloss [Gs(60-deg.)] is obtained by irradiating the surface of an electrodeposited copper foil with a measuring light at an incidence angle of 60-deg. and measuring the light intensity reflected at a reflection angle of 60-deg. The incidence angle as it is here referred to as, sets the perpendicular direction to the light irradiation surface to be 0-deg. JIS Z 8741-1997 describes five mirror-gloss measurement methods having different incidence angles, and provides to select an optimum incidence angle corresponding to the gloss of a sample. It describes that setting the incidence angle to be 60-deg. out of incidence angles allows the measurement in a wide range from samples of low gloss to samples of high gloss. Therefore, for the gloss measurement of the electrodeposited copper foil, etc. according to the present invention, 60-deg. is mainly employed.

For the evaluation of smoothness of the deposit side of an electrodeposited copper foil, the surface roughness Rzjis has generally been used as a parameter. However, Rzjis only provide information only in the height direction of irregularities, and cannot provide the information such as pitch in irregularities and undulation. Since the gloss is a parameter reflecting the information of the both, use of the gloss together with Rzjis allows collectively estimating various parameters such as the surface roughness pitch, undulation and uniformity in the plane.

The electrodeposited copper foil according to the present invention satisfies the conditions that the surface roughness (Rzjis) of the deposit side is lower than 1.0-micron meter, and the gloss [Gs(60-deg.)] thereof is not lower than 400. Namely, the electrodeposited copper foil whose quality can be guaranteed in such ranges and which can be supplied to markets have not conventionally been available. The appropriate use of a manufacturing method described later can even provide an electrodeposited copper foil having a surface roughness (Rzjis) of lower than 0.6-micron meter and a gloss [Gs(60-deg.)] of not lower than 700. The upper limit of gloss is not set up here, but judging from experience, the upper limit of the gloss [Gs(60-deg.)] is about 780. The gloss in the present invention is measured using a gloss meter VG-2000 manufactured by Nippon Denshoku Kogyo KK according to a measurement method of the gloss, JIS Z 8741-1997.

With respect to the electrodeposited copper foil as it is here referred to as, the thickness in not limited. This is because there is a favorable tendency of the deposit side having a lower roughness and a higher gloss as the foil becomes thicker. If the upper limit is positively set up, an electrodeposited copper foil having a thickness of not more than 450-micron meter, which is a commercially viable limit even when the electrodeposited copper foil is industrially manufactured, is aimed at.

Here, the lower limit of the surface roughness (Rzjis) of the deposit side is not set up. Depending on the sensitivity of a measuring instrument, the lower limit of the surface roughness is about 0.1-micron meter from experience. However, since there are variations in actual measurement, the lower limit as a reliable measurement is believed to be about 0.2-micron meter.

The gloss [Gs(60-deg.)] of the deposit side of the electrodeposited copper foil according to the present invention is divided into the TD gloss measured in the transverse direction and the MD gloss measured in the machine direction, and the ratio [TD gloss/MD gloss] is in the range of 0.9 to 1.1. This means a very small difference between in the transverse direction and in the machine direction.

Specifically, the generally accepted idea is that electrodeposited copper foils have mechanical properties different between in the transverse direction (TD) and in the machine direction (MD) under the influence of polishing streaks, etc. on the surface of a rotating drum as the cathode; however, the electrodeposited copper foil according to the present invention has a uniform smooth deposit side irrespective of its thickness, and a value of [(TD gloss)/(MD gloss)] of the gloss [Gs(60-deg.)] as its visual property is 0.9 to 1.1, whose variation range is less than 10%, thereby meaning very small variations of the surface shapes in the TD and MD of the electrodeposited copper foil according to the present invention.

Additionally, no difference in appearances in the TD and MD implies a uniformly formed electrolysis and uniformity in terms of crystalline structure. Specifically, this also means small differences in mechanical properties including tensile strengths and elongations between in the TD and MD. If the differences in mechanical properties between in the TD and MD are small in such a manner, effects on the dimensional change rates of boards and the straightness of circuits depending on directions of copper foils when printed wiring boards are manufactured become preferably small. In this connection, rolled copper foils, which can be said to be a representative of smooth-surface copper foils, are well known to have different mechanical properties between in the TD and MD due to their working method. Consequently, they receive an almost established valuation of being unsuitable for fine pattern applications because of a large dimensional change rate in film carrier tapes, thin rigid printed wiring boards, etc. which are applications the present invention expects.

By using [Gs(20-deg.)] and [Gs(60-deg.)] as the gloss, the difference from the conventional low-profile electrodeposited copper foils can be understood more clearly. Specifically, the electrodeposited copper foil according to the present invention can provide a relationship of the gloss [Gs(20-deg.)]>the gloss [Gs(60-deg.)] for the deposit side. For the same substance, evaluation of the gloss by selecting one incident angle is predicted to be a sufficient one, but even if the substance is the same, since the reflection is different depending on the incident angles, the distribution of the reflected light in the space varies depending on the surface irregularities in the sampling area with varied incident angles, thus causing differences in gloss. As a result of studies based on such a fact, the present inventors have found the following tendency from experience. Specifically, in the case of an electrodeposited copper foil of a high gloss and a low surface roughness, a relationship of the gloss [Gs(20-deg.)]>the gloss [Gs(60-deg.)]>the gloss [Gs(85 deg.)] is satisfied. In contrast, in the case of an electrodeposited copper foil of a low gloss and a low surface roughness, a relationship of the gloss [Gs(60-deg.)]>the gloss [Gs(20-deg.)]>the gloss [Gs(85-deg.)] is satisfied. In addition, in the case of an electrodeposited copper foil of matte and a low surface roughness, a relationship of the gloss [Gs(85-deg.)]>the gloss [Gs(60-deg.)]>the gloss [Gs(20-deg.)] is satisfied. As is clear from above, the valuation of the smoothness by a relationship of an absolute value of a gloss at a certain incident angle and an additional gloss measurement at a different incident angle, is significant.

For the electrodeposited copper foil according to the present invention, the surface condition of the shiny side is also important. The shiny side is required to have a surface roughness (Rzjis) and a gloss [Gs(60-deg.)] which are close to a level of the deposit side of the electrodeposited copper foil according to the present invention. Specifically, the electrodeposited copper foil according to the present invention preferably has a surface roughness (Rzjis) of lower than 2.0-micron meter and a gloss [Gs(60-deg.)] of not lower than 70 for its shiny side. More preferably, it is desirable that it has a surface roughness (Rzjis) of lower than 1.7-micron meter and a gloss [Gs(60-deg.)] of not lower than 100. The upper limit of the gloss [Gs(60-deg.)] of the shiny side is not specified, but speaking from experience, it is about 500. Namely, for obtaining the surface condition of the deposit side as described heretofore, formation of the surface condition as described here of the shiny side is preferable. Out of this condition, a difference in the surface conditions between in the TD and in the MD is liable to be increased, and differences in mechanical properties including tensile strengths, elongations and the like in the TD and in the MD are also liable to be increased. The surface condition of the shiny side is a transferred surface condition of a cathode as the electrodeposit surface, and is established by the surface condition of the cathode. Therefore, when an especially thin electrodeposited copper foil is manufactured, the cathode surface is required to have a property of a surface roughness (Rzjis) of lower than 2.0-micron meter.

As the mechanical properties of the electrodeposited copper foil according to the present invention, the tensile strength is not less than 33 kgf/mm$^2$ and the elongation thereof is not less than 5% for as received. After heating (180° C.×60 min, in the atmosphere), preferably, the tensile strength is not less than 30 kgf/mm$^2$, and the elongation is not less than 8%.

In the present invention, by optimizing the manufacturing condition, the electrodeposited copper foil can be provided with a more excellent mechanical properties of a tensile strength as received of not less than 38 kgf/mm$^2$ and that after heating (180° C.×60 min, in the air) of not less than 33 kgf/mm$^2$. Therefore, this favorable mechanical properties can not only fully bear bending usage of flexible printed wiring boards, but also are suitable for an application to current collecting materials constituting cathodes of lithium ion secondary batteries, which are subjected to the expansion/contraction behavior.

[Embodiments of the Surface-Treated Electrodeposited Copper Foil According to the Present Invention]

The surface-treated electrodeposited copper foil according to the present invention is obtained by subjecting at least one selected from rustproofing and silane coupling agent treatment on a surface of the above-mentioned electrodeposited copper foil. The rustproofing layer is to prevent oxidation corrosion of the electrodeposited copper foil surface so as not to bring about troubles in manufacturing processes of copper-clad laminates and printed wiring boards. It is further recommended to have a constitution of not inhibiting the adhesion with an insulating layer-forming material and if possible, improving that. A method used for rustproofing can be selected from one or combination of an organic rustproofing using benzotriazole, imidazole, etc. and an inorganic rustproofing using zinc, a chromate, a zinc alloy, etc. as long as suitable for their purposes and applications without problem.

The silane coupling agent treatment is a treatment to chemically improve the adhesion with an insulating layer-forming material after the rustproofing.

Now, a method for forming a rustproofing layer will be described. In the case of organic rustproofing, the layer can be formed by a method such as the immersion coating, showering coating or electrodeposition of an organic rust-preventive agent. In the case of inorganic rustproofing, a method of electroplating elements for rustproofing on the surface of an electrodeposited copper foil, the so-called substitute precipitation method, etc. are applicable. For example, when the zinc rustproofing is performed, a zinc pyrophosphate plating bath, zinc cyanide plating bath, zinc sulfate plating bath, etc. are applicable. For example, in the case of a zinc pyrophosphate plating bath, the conditions area concentration of zinc of 5 g/l to 30 g/l, that of potassium pyrophosphate of 50 g/l to 500 g/l, a solution temperature of 20-deg. C. to 50-deg. C., pH of 9 to 12 and a current density of 0.3 A/dm$^2$ to 10 A/dm$^2$, etc.

The silane coupling agent used in the above-mentioned silane coupling agent treatment is not required to be especially limited. In consideration of properties of both an insulating layer-forming material to be used and a plating solution used in the printed wiring board manufacturing process and the like, an epoxy-functional silane coupling agent, amino-functional silane coupling agent, mercapto-functional silane coupling agent, etc. are optionally selectively applicable. The silane coupling can be performed by employing a method such as the immersion coating, showering coating or electrodeposition of a silane coupling agent solution.

More specifically, centered on coupling agents similar to those used in prepreg glass cloth for printed wiring boards, vinyltrimethoxysilane, vinylphenyltrimethoxysilane, gamma-methacryloxypropyltrimethoxysilane, gamma-glycidoxypropyltrimethoxysilane, 4-glycidylbutyltrimethoxysilane, gamma-aminopropyltriethoxysilane, N-(beta-aminoethyl)-gamma-aminopropyltrimethoxysilane, N-3-(4-(3-aminopropoxy)butoxy)propyl-3-aminopropyltrimethoxysilane, imidazolesilane, triazinesilane, gamma-mercaptopropyltrimethoxysilane, etc. are applicable.

The surface roughness (Rzjis) of the bonding surface to an insulating layer-forming material of the above-mentioned surface-treated electrodeposited copper foil preferably has a low profile of not more than 1.5-micron meter. By adjusting the surface roughness in this range, the surface-treated electrodeposited copper foil becomes one suitable for forming fine-pitch circuits.

The gloss [Gs(60-deg.)] of the bonding surface to an insulating layer-forming material of the surface-treated electrodeposited copper foil is also preferably not lower than 250. Since a rustproofing layer and a silane coupling agent layer are formed by the surface treatment, even if the change in the surface roughness is below a detectable level, the light reflectance, etc. may vary between before and after the surface treatment. Therefore, although the absolute value of the gloss sometimes varies after the surface treatment, if the gloss [Gs(60-deg.)] on the bonding surface of the surface-treated electrodeposited copper foil keeps not lower than 250, the surface-treated layer can be judged to be formed in a suitable thickness.

The bonding surface to an insulating layer-forming material of the surface-treated electrodeposited copper foil is preferably roughened. Well-known methods are applicable to the roughening treatment, and performing of a minimum roughening treatment required including a combination with the rustproofing is sufficient. However, in forming a fine-pitch wiring below a pitch of 25-micron meter preferably used for the surface-treated electrodeposited copper foil according to the present invention, not being subjected to the roughening treatment is preferable to raise the set precision required of the over-etching time.

As a method of the roughening treatment, either a method involving adhering to form fine metal particles on the surface of an electrodeposited copper foil or a method involving forming a roughened surface by an etching method is employed. Now, as the former method of deposition for putting fine metal particles, a method of deposition for putting fine copper particles on the surface will be exemplified. This roughening treatment process is formed of a step of deposition for putting fine copper particles on the surface of the electrodeposited copper foil and a seal plating step to prevent dropping-off of the fine copper particles.

In the step of deposition for putting fine copper particles on the surface of an electrodeposited copper foil, the electrolysis condition employs the condition for burning plating. Therefore, the solution concentration used in the step of deposition for putting fine copper particles is generally a low concentration so as to easily make the burning plating condition. This burning plating condition is not especially limited, and is decided in consideration of qualities of production lines. For example, in the case of using a copper sulfate-based solution, the conditions are copper of 5 g/l to 20 g/l in concentration, free sulfuric acid of 50 g/l to 200 g/l in concentration, other additives as required (alpha-naphthoquinoline, dextrin, glue, thiourea, etc.), a solution temperature of 15-deg. C. to 40-deg. C., a current density of 10 A/dm$^2$ to 50 A/dm$^2$, etc.

The seal plating step to prevent dropping-off of fine copper particles is a step of uniformly depositing copper as is the case to coat fine copper particles by the level plating condition. Therefore, a copper electrolytic solution similar to that used in the afore-mentioned manufacturing process of an electrodeposited copper foil can be used as a supply source of copper ions. This level plating condition is not especially limited, and is decided in consideration of qualities of production lines. For example, in the case of using a copper sulfate-based solution, the conditions are copper of 50 g/l to 80 g/l in concentration, free sulfuric acid of 50 g/l to 150 g/l in concentration, a solution temperature of 40-deg. C. to 50-deg. C., a current density of 10 $A/dm^2$ to 50 $A/dm^2$, etc.

The bonding surface to an insulating layer-forming material of the surface-treated electrodeposited copper foil is preferably the deposit side. As described before, since the shiny side has a transferred shape of the surface shape of a cathode drum, making no difference at all between in the TD and in the MD is difficult. Therefore, for making variations in straightness of wiring edges, as are caused in the case of the shape of the bonding surface having directionality in TD/MD, to be little, the deposit side is preferred to be the bonding surface.

[Embodiments of the Manufacturing Method of the Electrodeposited Copper Foil According to the Present Invention]

The present invention provides a method for manufacturing the above-mentioned electrodeposited copper foil by peeling off copper deposited on the cathode surface by the electrolysis method using a sulfuric acid base copper electrolytic solution, characterized in that the sulfuric acid base copper electrolytic solution contains at least one selected from MPS or SPS, a quaternary ammonium salt polymer having a cyclic structure, and chlorine. Use of the sulfuric acid base copper electrolytic solution of this composition allows stable manufacturing of the low-profile electrodeposited copper foil according to the present invention. Further, by optimizing the electrolysis condition, the gloss [Gs(60-deg.)] exceeding 700 can be obtained. The copper concentration in this sulfuric acid base copper electrolytic solution is 40 g/l to 120 g/l, more preferably 50 g/l to 80 g/l; and the free sulfuric acid concentration is 60 g/l to 220 g/l, more preferably 80 g/l to 150 g/l.

The total concentration of MPS and/or SPS in the sulfuric acid base copper electrolytic solution according to the present invention is preferably 0.5 ppm to 100 ppm, more preferably 0.5 ppm to 50 ppm, further preferably 1 ppm to 30 ppm. With the concentration of MPS and/or SPS of less than 0.5 ppm, the deposit side of the electrodeposited copper foil tends to be rough, and it becomes difficult to obtain a low-profile electrodeposited copper foil. By contrast, with the concentration of MPS and/or SPS exceeding 100 ppm, the effect for making the deposit side of the obtained electrodeposited copper foil smooth is not improved, and only an increase in treating cost of the waste liquid is brought about. Now, MPS and/or SPS as they are referred to as in the present invention, involves their salts in their meaning, and a described value of the concentration is a converted one in terms of sodium 3-mercapto-1-propanesulfonate (hereinafter in the present application, referred to as "MPS-Na") as a sodium salt. MPS assumes the SPS structure through dimerization in the sulfuric acid base copper electrolytic solution according to the present invention; therefore, the concentration of MPS or SPS is a concentration including a single substance of 3-mercapto-1-propanesulfonic acid and salts such as MPS-Na, and additionally a substance added as SPS and modified substances polymerized into SPS, etc. after added as MPS in the electrolytic solution. The structural formula of MPS is shown below as Chemical Formula 1; and that of SPS is as Chemical Formula 2. From comparison of these structural formulas, the SPS structure is known to be a dimer of MPS.

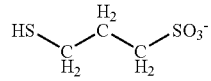

Chemical Formula 1

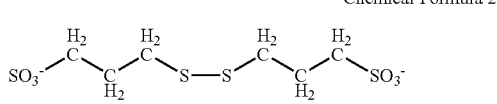

Chemical Formula 2

The concentration of the quaternary ammonium salt polymer having a cyclic structure in the sulfuric acid base copper electrolytic solution according to the present invention is preferably 1 ppm to 150 ppm, more preferably 10 ppm to 120 ppm, further preferably 15 ppm to 40 ppm. As the quaternary ammonium salt polymer having a cyclic structure, various kinds thereof are applicable, but in consideration of the effect of forming a low profile deposit side, a DDAC polymer is most preferably used. DDAC assumes a cyclic structure when making a polymerized structure and a part of the cyclic structure is formed of a nitrogen atom of the quaternary ammonium. Since the cyclic structure of the DDAC polymer is considered to be any of a four-membered ring to seven-membered ring or a mixture thereof, a compound having a five-membered ring out of these polymers is made to represent them, and is shown below as Chemical Formula 3. As is clear from Chemical Formula 3, this DDAC polymer has a polymer structure of dimer or more multimer.

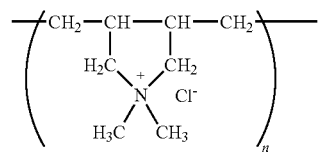

Chemical Formula 3

The concentration of the DDAC polymer in the sulfuric acid base copper electrolytic solution is preferably 1 ppm to 150 ppm, more preferably 10 ppm to 120 ppm, further preferably 15 ppm to 40 ppm. When the concentration of the DDAC polymer in the sulfuric acid base copper electrolytic solution is less than 1 ppm, the deposit side of an electrodeposited copper tends to be rough even though much the concentration of MPS or SPS may be raised, and obtaining a low-profile electrodeposited copper foil becomes difficult. When the concentration of the DDAC polymer in the sulfuric acid base copper electrolytic solution exceeds 150 ppm, the deposition of copper becomes unstable, and a low-profile electrodeposited copper foil is hardly obtained.

Further, the chlorine concentration in the sulfuric acid base copper electrolytic solution is preferably 5 ppm to 120 ppm, further preferably 10 ppm to 60 ppm. With the chlorine concentration of less than 5 ppm, the deposit side of the electrodeposited copper foil tends to be rough, and low profile cannot be maintained. By contrast, with the chlorine concentration exceeding 120 ppm, the deposit side of the electrodeposited copper foil tends to be rough; the electrodeposition cannot be stable; and a low profile deposit side cannot be formed.

As described above, the composition balance of MPS or SPS, the DDAC polymer, and chlorine in the sulfuric acid base copper electrolytic solution is most important. Deviation of their quantitative balance from the above range results a rough deposit side of the electrodeposited copper foil, and low profile cannot be maintained.

When an electrodeposited copper foil is manufactured by using the sulfuric acid base copper electrolytic solution, the electrolysis is performed using a cathode whose surface roughness is adjusted in a prescribed range and an insoluble anode. The electrolysis is recommended to be performed in a solution temperature of 20-deg. C. to 60-deg. C., more preferably 40-deg. C. to 55-deg. C., and at a current density of 15 A/dm$^2$ to 90 A/dm$^2$, more preferably 50 A/dm$^2$ to 70 A/dm$^2$.

In the manufacturing method of the electrodeposited copper foil according to the present invention, for stably obtaining properties the electrodeposited copper foil is required to have, the cathode surface state in manufacture must be managed. Referring to JIS C 6515, the specification of electrodeposited copper foil for a printed wiring board, the surface roughness (Rzjis) of a shiny side of an electrodeposited copper foil is required to have is provided to be a maximum of 2.4-micron meter. A cathode used for manufacturing the electrodeposited copper foil is a rotating cathode drum made of titanium (Ti) material, and cause changes in its appearance and its metal phase due to the surface oxidation during a continuous use. Therefore, periodic surface polishing, and/or machining such as polishing with a whetstone or lathing depends on its situations are required. Such machining of the cathode surface inevitably causes a streak-shaped working pattern in the circumferential direction because the cathode is worked while rotating. Hence, there is a difficulty in maintaining a low surface roughness (Rzjis) as it is in a steady state, and the above-mentioned specified value is allowed for from the viewpoint of cost and on condition of not cause obstacles on manufacturing printed wiring boards.

With respect to conventional electrodeposited copper foils, that the foils exhibit a tendency of having a rougher deposit side as the thickness goes up, and that electrodeposited copper foils obtained using a cathode drum having a roughness at an upper-limit level of the above-mentioned generally specified value or more has a tendency of having a high surface roughness of the deposit side under the influence of the surface shape of the cathode, are known from experience. By contrast, with respect to manufacturing the electrodeposited copper foil according to the present invention, use of the above-mentioned sulfuric acid base copper electrolytic solution allows forming a smooth deposit side by reducing the influence of the cathode shape in the process of becoming thicker while filling in the irregularities of the cathode surface. Therefore, even if a cathode whose surface is rough to some degree is used, the deposit side is hardly affected by the cathode surface shape as is the case with conventional electrodeposited copper foils. As long as the manufacturing method described here is employed, the thicker an electrodeposited copper foil is, the electrodeposited copper foil provided with the smoother deposit side is obtained.

However, when in an electrodeposited copper foil of less than 20-micron meter in thickness, the deposit side roughness (Rzjis) of lower than 1.0-micron meter is intended, use of a cathode having such a surface condition that the surface roughness (Rzjis) of the shiny side of the obtained electrodeposited copper foil is lower than 2.0-micron meter, preferably lower than 1.2-micron meter, and the gloss [Gs(60-deg.)] is not lower than 70, preferably not lower than 120 is preferable from the viewpoint of reducing the differences in the mechanical properties and surface properties in the TD and in the MD.

The present invention provides an electrodeposited copper foil manufactured by the above-mentioned manufacturing method.

[Embodiments of the Copper-Clad Laminate According to the Present Invention]

The present invention provides a copper-clad laminate obtained by laminating the above-mentioned surface-treated electrodeposited copper foil and an insulating layer-forming material. With respect to manufacturing methods of the copper-clad laminates, the roll lamination system and the casting system of conventional methods are useable for flexible copper-clad laminates; and the hot press system and the continuous lamination system are applicable for manufacturing rigid copper-clad laminates. Now, the flexible copper-clad laminates and rigid copper-clad laminates as they are referred to as in the present invention, are a concept involving all of single-sided copper-clad laminates, double-sided copper-clad laminates and multi-layered copper-clad laminates. The multi-layered copper-clad laminate is formed of the surface-treated copper foil according to the present invention for its outer layer and an inner layer core provided with an inner layer circuit for its inner layer. On description of copper-clad laminates hereinafter, these are not differentiated because they overlap.

The present invention provides a rigid copper-clad laminate, in which the above-mentioned insulating layer-forming material contains a skeletal material. Most of the skeletal material used in conventional rigid copper-clad laminates is a glass woven fabric or a glass paper, and it has been reported that such problems possibly arise that the roughness of the copper foil bonding surface affects the interlayer insulation in the case of a level exceeding 10-micron meter and affects the migration resistance by direct contact of the glass fiber of the skeletal material and a circuit even in the case of not more than 10-micron meter. It has been said that if the roughness is around 5-micron meter, those problems would not arise. However, in recent years, finer patterns than ever are required in, for example, BGA and CSP of package boards on which electronic components are directly mounted, and making the surface smooth has been tried, for example, by using as the skeletal material a paper of a finer aramid fiber than a glass fiber. In the case of mounting components, etc. whose clock frequency is high, if the straightness and cross-sectional shape of circuits are far apart from the ideal state, the transmission characteristic of signals especially in a high frequency range is not satisfied. Accordingly, the copper-clad laminate according to the present invention is suitable for manufacturing applications of printed wiring boards having of fine patterns and especially high-frequency signal transmission circuits.

Further, the present invention provides a flexible copper-clad laminate in which the above-mentioned insulating layer-forming material is formed of a flexible material having flexibility. The flexible copper-clad laminate segregates its applications from the above-mentioned rigid copper-clad laminate due to its flexibility and lightweight, and the insulating layer-forming material is tried to reduce its thickness to accomplish the lightweight and a high flexibility. At the same time, conductor layers as well are required to reduce the thickness, and electrodeposited copper foils have become a major material. Since securing of the insulation reliability is required for thin films, and a low profile of not more than $\frac{1}{10}$ of the insulating layer thickness is required for the bonding surface especially in multi-layered flexible board applications, the above-mentioned surface roughness (Rzjis) of about 5-micron meter is an applicable upper limit if the copper-clad laminate is a conventional one. However, in the flexible copper-clad laminates using the electrodeposited copper foil of the present invention, even if the film thickness is further reduced, the insulation reliability is secured. Further, the flexible copper-clad laminates are more flexible than flexible copper-clad laminates using conventional low-profile electrodeposited copper foils, thus providing a more reliable copper-clad laminate also in this respect.

Now, manufacturing methods of a rigid copper-clad laminate and a flexible copper-clad laminate will be specifically exemplified. When a rigid copper-clad laminate or a flexible copper-clad laminate is manufactured, a desired lay-up state is formed using the surface-treated electrodeposited copper foil according to the present invention, a rigid insulating layer forming material such as a prepreg of FR-4 class or a flexible insulating layer forming material such as a polyimide resin film, and a flat plate, and molded by hot press at 170° C. to 200° C.

On the other hand, for the flexible copper-clad laminate, the above-mentioned roll lamination system and casting system are employable. The roll lamination system is a method in which a web of the surface-treated copper foil according to the present invention and a resin film web such as polyimide resin film or PET film are heat-pressed by the pressure of a heating roller in the Roll to Roll system. The casting system involves directly forming a polyimide resin film on the surface of the surface-treated copper foil according to the present invention by forming a resin composition film, such as a polyamic acid, which is converted into a polyimide resin by heating, on the surface-treated copper foil, and heat to cause the condensation reaction.

[Embodiments of the Printed Wiring Board According to the Present Invention]

The present invention provides a rigid printed wiring board characterized by being obtained using the above-mentioned rigid copper-clad laminate. For manufacturing a printed wiring board using the copper-clad laminate with an electrodeposited copper foil, whose bonding surface is smooth, according to the present invention as described before, of course, the subtractive method and also the pattern plating/flash etching method are applicable.

Since the over-etching time can be set to be short in either method, the edge of the obtained circuit becomes more linear, and its cross-section becomes more rectangular. Therefore, the printed wiring board is excellent in overall reliability, which is excellent in the inter-circuit insulation reliability in fine patterns, is simultaneously excellent especially in the signal transmission characteristic in a high-frequency region flowing in the vicinity of the circuit surface by the skin effect, and hardly causes noises such as crosstalk.

The present invention further provides a flexible printed wiring board characterized by being obtained using the above-mentioned flexible copper-clad laminate. For manufacturing the printed wiring board, of course the subtractive method and also the pattern plating/flash etching method are applicable. Since the over-etching time can be set to be short in either method, the edge of the obtained circuit becomes more linear, and its cross-section becomes more rectangular. Therefore, the printed wiring board is excellent in reliability, which is excellent in the signal transmission characteristic in a high frequency region, and hardly causes noises such as crosstalk; and simultaneously, it is excellent in the insulation reliability and flexibility, and exhibits the most superiority especially when the board is made to be a film carrier on which devices are directly mounted.

Now, one example of common processing methods in the case of processing into printed wiring boards by using either of the rigid. copper-clad laminate or a flexible copper-clad laminate (hereinafter, simply referred to as "copper-clad laminate") will be described to make sure of it. First, an etching resist layer is formed on a copper-clad laminate surface, exposed with an etching circuit pattern, and developed to form an etching resist pattern. For the etching resist layer, a photosensitive resin such as a dry film or a liquid resist is used. Besides, the exposure is generally UV exposure, and forming methods of an etching resist pattern based on common methods are employable.

Then, the electrodeposited copper foil is subjected to the etching processing into a circuit shape by using a copper etching solution; and stripping of the etching resist is performed to form a desired circuit shape on the surface of the rigid board or the flexible board. For the etching solution, all copper etching solutions of an acidic copper etching solution, an alkali copper etching solution, etc. are applicable.

The copper-clad laminate as it is referred to as above in the present invention, is described as a concept containing all of single-sided copper-clad laminates, double-sided copper-clad laminates and multi-layered copper-clad laminates internally provided with inner layer circuits. Therefore, in the case of double-sided copper-clad laminates and multi-layered copper-clad laminates, there are cases necessary to secure the interlayer connection, in which cases the shape formation by common methods such as through-hole and via hole is performed, and thereafter the conductive plating treatment is performed to obtain the interlayer connection. Generally, the conductive plating treatment involves performing the activation treatment by a palladium catalyst, performing the electroless copper plating, and thereafter performing the film thickness growing by the electrolytic copper plating.

After the copper etching finishes, the resultant is fully washed with water, dried, and as required, subjected to the rustproofing, etc. to make a rigid printed wiring board or a flexible printed wiring board.

EXAMPLES

Examples and Comparative Examples used titanium plate electrodes whose surface roughness (Rzjis) was adjusted to 0.85-micron meter by polishing their surface with a polishing paper of No. 2,000, with consideration paid so as not to be affected by the surface shape of the cathodes.

First Example Group

In a first example group, Example 1 to Example 8 was practiced. Example 1 to Example 8 each used a solution as the sulfuric acid base copper electrolytic solution, in which the copper concentration and the free sulfuric acid concentration of a copper sulfate solution were adjusted to 80 g/l and 140 g/l, respectively, and the concentrations of MPS, a DDAC polymer (Unisence FPA100L, manufactured by Senka Corp.) and chlorine were adjusted to the concentrations described in Table 1. In Example 9, SPS, which is a dimer of MPS, was used in place of MPS.

TABLE 1

| Object | Additive concentration (ppm) | | |
| --- | --- | --- | --- |
|  | MPS-Na | DDAC polymer | Chlorine |
| Example 1 | 5 | 3 | 10 |
| Example 2 | 5 | 3 | 10 |
| Example 3 | 7 | 5 | 10 |
| Example 4 | 7 | 5 | 10 |
| Example 5 | 4 | 3 | 10 |

TABLE 1-continued

| | Additive concentration (ppm) | | |
|---|---|---|---|
| Object | MPS-Na | DDAC polymer | Chlorine |
| Example 6 | 4 | 3 | 10 |
| Example 7 | 21 | 20 | 10 |
| Example 8 | 21 | 20 | 10 |
| Example 9 | 7* | 5 | 10 |

*the MPS-Na concentration in Example 9 is a converted value of the case where SPS is converted to a Na salt.

Preparation of Electrodeposited Copper Foils was performed by using DSA as an anode, and electrolyzing at a solution temperature of 50-deg. C. in a current density of 60 A/dm² to obtain nine kinds of electrodeposited copper foils of 12-micron meter and 210-micron meter in thickness. The mechanical properties of the copper foils specifically of 12-micron meter among them were evaluated. The results are shown in Table 2.

conditions were a chromic acid concentration of 5.0 g/l, pH of 11.5, a solution temperature of 35-deg. C., a current density of 8 A/dm² and an electrolysis time of 5 sec.

After the rustproofing was finished as described above, the rustproofing layer was rinsed with water, and immediately a silane coupling agent was adsorbed on the rustproofing layer of the deposit side in a silane coupling agent bath. The solution composition was pure water as a solvent, and gamma-glycidoxypropyltrimethoxysilane of 5 g/l in concentration. Then, the adsorption treatment was performed by spraying the solution by showering.

After the silane coupling agent treatment was finished, the moisture was finally volatilized by an electric heater to obtain nine kinds of surface-treated electrodeposited copper foils. According to the crystalline structure analysis of the obtained electrodeposited copper foils, the average crystal grain size was larger than that of electrodeposited copper foils which are

TABLE 2

| | | Electrodeposited copper foil property | | | |
|---|---|---|---|---|---|
| | Copper foil | As received | | After heating (180° C. × 60 min.) | |
| | thickness (micron meter) | Tensile strength (kgf/mm²) | Elongation (%) | Tensile strength (kgf/mm²) | Elongation (%) |
| Example 1 | 12 | 38.2 | 6.2 | 34.6 | 9.8 |
| Example 3 | 12 | 36.6 | 8.2 | 32.9 | 10.3 |
| Example 5 | 12 | 39.3 | 8.1 | 34.3 | 11.0 |
| Example 7 | 12 | 35.3 | 7.7 | 31.7 | 10.5 |
| Example 9 | 12 | 36.7 | 7.9 | 32.2 | 11.0 |
| Comparative Example 1 | 12 | 36.2 | 4.0 | 32.4 | 5.6 |
| Comparative Example 2 | 12 | 31.4 | 3.5 | 26.8 | 5.8 |
| Comparative Example 3 | 12 | 40.5 | 3.6 | 39.5 | 4.4 |
| Comparative Example 4 | 12 | 38.6 | 4.0 | 37.4 | 4.8 |

Then, a rustproofing was performed on both surfaces of the electrodeposited copper foils. An inorganic rustproofing under the following conditions was employed. A zinc rustproofing was performed, using a zinc sulfate bath of a free sulfuric acid concentration of 70 g/l and a zinc concentration of 20 g/l, at a solution temperature of 40-deg. C. in a current density of 15 A/dm².

Further, in the Examples, a chromate layer was formed by electrolysis on the zinc rustproofing layers. The electrolysis used for conventional film carrier tapes and made to be of a low profile by micro-crystallization, and the presence of twin crystals was confirmed. The surface roughness (Rzjis) and the gloss [Gs(20-deg.)], [Gs(60-deg.)] and [Gs(85-deg.)] of a deposit side of the electrodeposited copper foils, and the surface roughnesses (Rzjis) and the gloss [Gs(60-deg.)] of the deposit side of the surface-treated electrodeposited copper foils, obtained as described above, are shown in Table 3.

TABLE 3

| | Copper foil | Electrodeposited copper foil deposit side | | | | | | | | Surface-treated copper foil deposit side | | |
|---|---|---|---|---|---|---|---|---|---|---|---|---|
| | thickness | Rzjis | Gloss | | | | | | | Rzjis | Gloss | |
| | (micron meter) | (micron meter) | Gs(20-deg.) | | Gs(60-deg.) | | | Gs(85 deg.) | | (micron meter) | Gs(60 deg.) | |
| | | | TD | MD | TD | MD | TD/MD | TD | MD | | TD | MD |
| Example 1 | 12 | 0.30 | 844 | 988 | 652 | 675 | 0.97 | 129 | 138 | 0.32 | 621 | 647 |
| Example 2 | 210 | 0.27 | 1169 | 1263 | 624 | 661 | 0.94 | 124 | 129 | 0.33 | 592 | 602 |
| Example 3 | 12 | 0.33 | 910 | 970 | 647 | 673 | 0.96 | 129 | 140 | 0.29 | 597 | 613 |
| Example 4 | 210 | 0.29 | 1074 | 1144 | 656 | 670 | 0.98 | 115 | 128 | 0.36 | 546 | 547 |
| Example 5 | 12 | 0.35 | 718 | 838 | 643 | 660 | 0.97 | 123 | 138 | 0.33 | 581 | 602 |
| Example 6 | 210 | 0.34 | 1147 | 1182 | 631 | 662 | 0.95 | 112 | 119 | 0.36 | 587 | 582 |
| Example 7 | 12 | 0.33 | 941 | 1043 | 650 | 677 | 0.96 | 132 | 142 | 0.30 | 606 | 611 |
| Example 8 | 210 | 0.30 | 1223 | 1271 | 661 | 692 | 0.96 | 118 | 124 | 0.32 | 576 | 576 |

TABLE 3-continued

| Copper foil | Electrodeposited copper foil deposit side | | | | | | | | | Surface-treated copper foil deposit side | | |
|---|---|---|---|---|---|---|---|---|---|---|---|---|
| | Rzjis | Gloss | | | | | | | | Rzjis | Gloss | |
| thickness | | Gs(20-deg.) | | Gs(60-deg.) | | | Gs(85 deg.) | | | | Gs(60 deg.) | |
| (micron meter) | (micron meter) | TD | MD | TD | MD | TD/MD | TD | MD | | (micron meter) | TD | MD |
| Example 9 | 12 | 0.34 | 800 | 824 | 650 | 674 | 0.96 | 117 | 133 | 0.32 | 618 | 623 |
| Comparative Example 1 | 12 | 0.85 | — | — | — | 283 | — | — | — | — | — | — |
| | 210 | 0.70 | — | — | — | 221 | — | — | — | — | — | — |
| Comparative Example 2 | 12 | 0.83 | — | — | — | 374 | — | — | — | — | — | — |
| | 210 | 1.22 | — | — | — | 386 | — | — | — | — | — | — |
| Comparative Example 3 | 12 | 3.60 | — | — | — | 0.7 | — | — | — | — | — | — |
| Comparative Example 4 | 12 | 3.59 | — | — | — | 1.0 | — | — | — | — | — | — |

Second Example Group

A second example group includes Example 10 to Example 14, which each used a solution as the sulfuric acid base copper electrolytic solution, in which the copper concentration and the free sulfuric acid concentration were adjusted to 80 g/l and 140 g/l, respectively, and the concentrations of SPS, a DDAC polymer (Unisence FPA100L, manufactured by Senka Corp.) and chlorine were adjusted to the concentrations described in Table 4.

TABLE 4

| | Additive concentration (ppm) | | |
|---|---|---|---|
| | SPS-Na | DDAC polymer | Chlorine |
| Example 10 | 5 | 30 | 25 |
| Example 11 | 10 | 20 | 22 |
| Example 12 | 100 | 100 | 100 |
| Example 13 | 50 | 70 | 100 |
| Example 14 | 50 | 100 | 50 |

Preparation of Electrodeposited Copper Foils was performed by using DSA as an anode, and electrolyzing at a solution temperature of 50-deg. C. in a current density of 60 A/dm² to obtain two kinds of electrodeposited copper foils of 12-micron meter and 70-micron meter in thickness in Example 10, and four kinds of electrodeposited copper foils of 12-micron meter in thickness in Example 11 to Example 14.

The tensile strengths and the elongations as received and after 180° C.×60 min-heating of the 12-micron meter and 70-micron meter electrodeposited copper foils obtained in Example 10, are shown in Table 5. The tensile strength as received of the 12-micron meter electrodeposited copper foil is 35.5 kgf/mm²; the elongation thereof is 11.5%; and the tensile strength after 180° C.×60 min-heating is 33.2 kgf/mm²; and the elongation thereof is 11.2%. These favorable mechanical properties are at a level of sufficiently applicable for bending usage of flexible printed wiring boards.

TABLE 5

| Copper thickness (micron meter) | As received | | 180° C. × 60 min. After heating | |
|---|---|---|---|---|
| | Tensile strength Kgf/mm² | Elongation % | Tensile strength Kgf/mm² | Elongation % |
| Example 10 | | | | |
| 12 | 35.5 | 11.5 | 33.2 | 11.2 |
| 70 | 34.4 | 28.0 | 32.3 | 31.8 |
| Comparative Example 5 | | | | |
| 12 | 37.9 | 8.0 | 31.6 | 7.5 |

According to the evaluation of the 12-micron meter electrodeposited copper foil as itself for folding endurance test by the MIT method, it exhibited to be able to bear a bending test of 1,200 to 1,350 times for as received, and that of 800 to 900 times for after heating. The test by the MIT method is conducted using a film folding endurance tester (model No.: 549) with furnace manufactured by Toyo Seiki Seisaku-sho, Ltd. as a MIT folding endurance test apparatus, and with a bending radius of 0.8 mm, a load of 0.5 kgf and a sample size of 15 mm×150 mm. The obtained values exhibit that the evaluated electrodeposited copper foil has the double folding endurance with those of conventional general-purpose electrodeposited copper foils because when the general-purpose electrodeposited copper foil shaving been used conventionally for flexible printed wiring boards are evaluated in the same conditions, they show about 600 times for as received and about 500 times for after heating. This difference is presumed to be due to the effect that cracks, which triggers a break, are hard to be formed due to their smooth surface.

The electrodeposited copper foils obtained above were immersed in a dilute sulfuric acid solution of 150 g/l in concentration and of a solution temperature of 30-deg. C. for 30 seconds to remove foreign materials and surface oxides, and washed with water. For the 12-micron meter electrodeposited copper foil and the 70-micron meter electrodeposited copper foil obtained in Example 10, two kinds of the surface-treated electrodeposited copper foil which was roughened and the surface-treated electrodeposited copper foil which was not roughened were prepared, respectively, to prepare four kinds in total of surface-treated electrodeposited copper foils.

After the pickling treatment of the 12-micron meter electrodeposited copper foil and the 70-micron meter electrodeposited copper foil among the above which were objects of a roughening treatment was finished, the foils were subjected to, as a process to form fine copper particles on the deposit side of the electrodeposited copper foil, a step of deposition for putting fine copper particles on the deposit side of the electrodeposited copper foils and a seal plating step to prevent the dropping-off of the fine copper particles. The former step of deposition for putting fine copper particles was performed by electrolysis for 5 seconds under the conditions of a copper concentration of 15 g/l and a free sulfuric acid concentration of 100 g/l of a copper sulfate solution, a solution temperature of 25-deg. C., and a current density of 30 A/dm².

After the fine copper particles were deposited and put on a deposit side, copper was uniformly deposited so as to seal the fine copper particles under the level plating condition as a seal plating step to prevent dropping-off of the fine copper particles. The level plating was performed by electrolysis for 5 seconds under the conditions of a copper concentration of 60 g/l and a free sulfuric acid concentration of 100 g/l of a copper sulfate solution, a solution temperature of 45-deg. C., and a current density of 45 A/dm².

Both surfaces of all the electrodeposited copper foils obtained in the Examples were subjected to a rustproofing. The inorganic rustproofing under the following conditions was employed. The zinc rustproofing was performed using a zinc sulfate bath of a free sulfuric acid concentration of 70 g/l and a zinc concentration of 20 g/l, at a solution temperature of 40-deg. C. in a current density of 15 A/dm².

A chromate layer was further formed on the zinc rustproofing layers by electrolysis. The electrolysis conditions were a chromic acid concentration of 5.0 g/l, pH of 11.5, a solution temperature of 35-deg. C., a current density of 8 A/dm², and an electrolysis time of 5 sec.

After the rustproofing was finished as above and rinsed with water, immediately a silane coupling agent was adsorbed on the rustproofing layers of a deposit side. The solution composition for this was pure water as a solvent and gamma-glycidoxypropyltrimethoxysilane of 5 g/l in concentration. The adsorption treatment was performed by spraying the solution by showering. After the silane coupling agent treatment was finished, the moisture was finally volatized by an electric heater to obtain six kinds of surface-treated electrodeposited copper foils including one kind of the roughened foil.

The surface roughness (Rzjis) and the gloss [Gs(60-deg.)] of the shiny side of the electrodeposited copper foils obtained in Example 10 to Example 14, and the surface roughness (Rzjis) and the gloss [Gs(20-deg.)], [Gs(60-deg.)] and [Gs(85-deg.)] of a deposit side thereof, and the surface roughness (Rzjis) and the gloss [Gs(60-deg.)] of a deposit side of the surface-treated foils obtained in Example 10, and the surface roughness (Rzjis) of the roughened surface of the roughened foil thereof, are shown in Table 6.

TABLE 6

| | Electrodeposited copper foil | | | | | | | | | | | Surface-treated copper foil | | | Roughened surface |
|---|---|---|---|---|---|---|---|---|---|---|---|---|---|---|---|
| | Copper | Shiny side | | | deposit side | | | | | | | deposit side | | | |
| | thickness | Gloss Gs(60-deg.) | | Rzjis (micron | Gloss Gs(20-deg.) | | Gloss Gs(60-deg.) | | | Gloss Gs(85-deg.) | | Rzjis (micron | Gloss Gs(60-deg.) | | Rzjis (micron | Rzjis (micron |
| | (micron meter) | TD | MD | meter) | TD | MD | TD | MD | TD/MD | TD | MD | meter) | TD | MD | meter) | meter) |
| Example 10 | 12 | 165 | 311 | 0.87 | 1027 | 1058 | 659 | 665 | 0.99 | 142 | 139 | 0.32 | 540 | 514 | 0.28 | 0.97 |
| | 70 | 140 | 291 | 0.84 | 1510 | 1506 | 691 | 686 | 1.01 | 149 | 150 | 0.17 | 570 | 570 | 0.15 | — |
| Example 11 | 12 | 157 | 294 | 1.14 | 925 | 1206 | 735 | 759 | 0.97 | 114 | 112 | 0.30 | — | — | — | — |
| Example 12 | 12 | 158 | 279 | 0.91 | 823 | 976 | 613 | 651 | 0.94 | 98 | 118 | 0.39 | — | — | — | — |
| Example 13 | 12 | 159 | 295 | 0.97 | 800 | 955 | 603 | 665 | 0.91 | 116 | 129 | 0.41 | — | — | — | — |
| Example 14 | 12 | 158 | 295 | 1.02 | 867 | 968 | 627 | 649 | 0.97 | 114 | 129 | 0.32 | — | — | — | — |
| Comparative Example 5 | 12 | 150 | 260 | 1.14 | 116 | 126 | 324 | 383 | 0.85 | 111 | 117 | 1.00 | 150 | 260 | 0.98 | 1.70 |

COMPARATIVE EXAMPLES

Comparative Example 1

This Comparative Example was a tracing experiment of example 1 described in Patent Document 2. A basis solution as the sulfuric acid base copper electrolytic solution was one in which copper sulfate (reagent) and sulfuric acid (reagent) were dissolved in pure water, where the copper sulfate concentration (in terms of pentahydrate) was 280 g/l, and the free sulfuric acid concentration was 90 g/l. A sulfuric acid base copper electrolytic solution was prepared by adjusting concentration of a copolymer (trade name: PAS-A-5, a weight-average molecular weight of 4,000, manufactured by Nitto Boseki Co., Ltd.) of a diallyldialkylammonium salt and sulfur dioxide to 4 ppm, a polyethylene glycol (an average molecular weight of 1,000) to 10 ppm and MPS-Na to 1 ppm, and further adjusting chlorine concentration to 20 ppm by using sodium chloride.

The electrolysis was performed using a lead plate as an anode, at a temperature of the above electrolytic solution of 40-deg. C. in a current density of 50 A/dm² to obtain electrodeposited copper foils of 12-micron meter and 210-micron meter in thickness. The mechanical properties of the electrodeposited copper foils are shown in Table 2 together with Examples; and the surface roughness (Rzjis) and the gloss [Gs(60-deg.)] of a deposit side are shown in Table 3 together with Examples.

Comparative Example 2

In this Comparative Example, a solution as the sulfuric acid base copper electrolytic solution of a copper concentration of 90 g/l and a free sulfuric acid concentration of 110 g/l was subjected to a cleaning treatment through an activated carbon filter. A copper electrolytic solution was prepared by adding, to the cleaned solution, MPS-Na so as to be 1 ppm in concentration; a hydroxyethylcellulose as a macromolecular polysaccharide, 5 ppm; a low molecular glue (a number-average molecular weight of 1,560), 4 ppm; and chlorine, 30 ppm. The electrolysis was performed using the copper electrolytic solution thus prepared and using a DSA electrode as the anode, at a solution temperature of 58-deg. C. in a current density of 50 A/dm$^2$ to obtain electrodeposited copper foils of 12-micron meter and 210-micron meter in thickness. The mechanical properties of the electrodeposited copper foils are shown in Table 2 together with Examples; and the surface roughness (Rzjis), the gloss, etc. of a deposit side, in Table 3.

Comparative Example 3

In this Comparative Example, a solution as the sulfuric acid base copper electrolytic solution of a copper concentration of 80 g/l, a free sulfuric acid concentration of 140 g/l, a DDAC polymer (Unisence FPA100L, manufactured by Senka Corp.) concentration of 4 ppm and a chlorine concentration of 15 ppm, was used. The electrolysis was performed using a DSA electrode as the anode, at a solution temperature of 50-deg. C. in a current-density of 60 A/dm$^2$ to obtain an electrodeposited copper foil of 12-micron meter in thickness. The mechanical properties of the electrodeposited copper foil are shown in Table 2 together with Examples; and the surface roughness (Rzjis), the gloss, etc. of the deposit side, in Table 3.

Comparative Example 4

In this Comparative Example, a solution as the sulfuric acid base copper electrolytic solution of a copper concentration of 80 g/l, a free sulfuric acid concentration of 140 g/l, a DDAC polymer (Unisence FPA100L, manufactured by Senka Corp.) concentration of 4 ppm, a low molecular weight glue (a number-average molecular weight of 1,560) concentration of 6 ppm and a chlorine concentration of 15 ppm, was used. The electrolysis was performed using a DSA electrode as the anode, at a solution temperature of 50-deg. C. in a current density of 60 A/dm$^2$ to obtain an electrodeposited copper foil of 12-micron meter in thickness. The mechanical properties of the electrodeposited copper foil are shown in Table 2 together with Examples; and the surface roughness (Rzjis) and the gloss [Gs(60-deg.)] of the deposit side, in Table 3.

Comparative Example 5

This Comparative Example was a tracing experiment of example 4 described in Patent Document 2. A basis solution as the sulfuric acid base copper electrolytic solution was one in which copper sulfate (reagent) and sulfuric acid (reagent) were dissolved in pure water, where the copper sulfate concentration (in terms of pentahydrate) was 280 g/l, and the free sulfuric acid concentration was 90 g/l. The electrolytic solution was prepared by adjusting a copolymer (trade name: PAS-A-5, a weight-average molecular weight of 4,000, manufactured by Nitto Boseki Co., Ltd.) of a diallyldialkylammonium salt and sulfur dioxide to 4 ppm in concentration, a polyethylene glycol (an average molecular weight of 1,000) to 10 ppm in concentration and MPS-Na to 1 ppm in concentration, and further adjusting chlorine to 20 ppm in concentration using sodium chloride.

The electrolysis was performed using a lead plate as the anode, at a temperature of the above electrolytic solution of 40-deg. C. in a current density of 50 A/dm$^2$ to obtain electrodeposited copper foils of 12-micron meter and 70-micron meter in thickness. Thereafter, two kinds of electrodeposited copper foils were obtained as in Example 10. The mechanical properties of the electrodeposited copper foils as received and after 180° C.×60 min-heating are shown in Table 5; and the surface roughness (Rzjis) and the gloss [Gs(20-deg.)], [Gs(60-deg.)] and [Gs(85-deg.)] of the deposit side of the electrodeposited copper foil, the surface roughness (Rzjis) and the gloss [Gs(60-deg.)] of the deposited side after the surface treatment, and the surface roughness (Rzjis) of the roughened surface of the roughened foil, are shown in Table 6.

Comparison of Examples and Comparative Examples

Hereinafter, the results of comparing Comparative Examples and Examples will be described. Any deposit side of the electrodeposited copper foils obtained in Examples satisfies whole specifications of the present invention of the surface roughness (Rzjis)<1.0-micron meter, the gloss [Gs (60-deg.)]>400, the TD/MD ratio of 0.9 to 1.1, and [Gs(20-deg.)]>[Gs(60-deg.)]>[Gs(85-deg.)]. The mechanical properties are also satisfied in whole specifications of the present invention of not less than 33 kgf/mm$^2$ in tensile strength and of not less than 5% in elongation for as received, and of not less than 30 kgf/mm$^2$ in tensile strength and of not less than 8% in elongation for after heating.

Comparison of Examples and Comparative Example 1

Comparing the surface roughness (Rzjis) of a deposit side of the electrodeposited copper foils, the electrodeposited copper foil of Comparative Example 1 is also made to have a favorable low profile. However, while any surface roughness (Rzjis) of a deposit side of the 12-micron meter electrodeposited copper foils of the present invention is 0.30-micron meter to 0.41-micron meter, the surface roughness (Rzjis) of the deposit side of the 12-micron meter electrodeposited copper foil of Comparative Example 1 is 0.85-micron meter; and while any surface roughness (Rzjis) of a deposit side of the 210-micron meter electrodeposited copper foils of the present invention is 0.27-micron meter to 0.34-micron meter, the surface roughness (Rzjis) of the deposit side of the 210-micron meter electrodeposited copper foil of Comparative Example 1 is 0.70-micron meter. Therefore, a tendency that a smoother deposit side is obtained when the thickness of the copper foil goes up is common, but the electrodeposited copper foil according to the present invention is superior in the value itself of smoothness. Comparing the gloss [Gs(60-deg.)], while the gloss [Gs(60-deg.)] of Comparative Example 1 is in the range of 221 to 283, the gloss [Gs(60-deg.)] of Examples exhibit the range of 603 to 759, which are far different. Consequently, the electrodeposited copper foils of Examples can be said to have a deposit side which is smoother and closer to a mirror surface than the electrodeposited copper foil of Comparative Example 1. With respect to the mechanical properties, the 12-micron meter electrodeposited copper foil of Comparative Example 1 has a tensile strength of 36.2 kgf/mm$^2$ and an elongation of 4.0% for as received, and a tensile strength of 32.4 kgf/mm$^2$ and an elongation of 5.6% for after heating. The tensile strength as received only can be said to be the same as that of the electrodeposited copper foils of Examples.

Comparison of Examples and Comparative Example 2

Comparing a surface roughness (Rzjis) of a deposit side of the electrodeposited copper foils, the electrodeposited copper foil of Comparative Example 2 is also made to have a favorable low profile. However, while any surface roughness (Rzjis) of the deposit side of the 12-micron meter electrodeposited copper foils of the present invention is 0.30-micron meter to 0.41-micron meter, the surface roughness (Rzjis) of the deposit side of the 12-micron meter electrodeposited copper foil of Comparative Example 2 is 0.83-micron meter; and while any surface roughness (Rzjis) of a deposit side of the 210-micron meter electrodeposited copper foils of the present invention is 0.27-micron meter to 0.34-micron meter, the surface roughness (Rzjis) of the deposit side of the 210-micron meter electrodeposited copper foil of Comparative Example 2 is 1.22-micron meter. Therefore, in Comparative Example 2, since the smoothness of the deposit side is worsened when the thickness of the copper foil goes up, a stably smooth electrodeposited copper foil is considered to be hard to obtain. With respect to the mechanical properties, the 12-micron meter electrodeposited copper foil of Comparative Example 2 has a tensile strength of 31.4 kgf/mm$^2$ and an elongation of 3.5% for as received, and a tensile strength of 26.8 kgf/mm$^2$ and an elongation of 5.8% for after heating; therefore, the electrodeposited copper foils of Examples are superior.

Comparison of Examples and Comparative Example 3

Comparative Example 3 is to examine the effects in the case where MPS and SPS are not present in the copper electrolytic solution. As can be seen from Table 3, the surface roughness (Rzjis) of the deposit side of the electrodeposited copper foil obtained in Comparative Example 3 in which MPS, etc. are not contained in the copper electrolytic solution exhibits 3.60-micron meter, thus a low profile is not achieved. As for the gloss [Gs(60-deg.)], since the gloss turns to matte, it exhibits a remarkably low value of 0.7. Then, although the mechanical properties of the 12-micron meter copper foil exhibits a large value of 40.5 kgf/mm$^2$ in tensile strength, the elongation is as small as 3.6%, and its change by heating is small. Consequently, the electrodeposited copper foils according to the present invention can be said to be superior in the surface roughness and the elongation.

Comparison of Examples and Comparative Example 4

Comparative Example 4 is to examine the effects in the case of adding a low molecular glue in the copper electrolytic solution in place of MPS. As a result, as can be seen from Table 3, even if a low molecular glue is contained in the copper electrolytic solution in place of MPS, the surface roughness (Rzjis) of the deposit side of the electrodeposited copper foil exhibits 3.59-micron meter, thus a low profile is not achieved. As for the gloss [Gs(60-deg.)], since the gloss turns to matte, it exhibits a remarkably low value of 1.0. Although the mechanical properties exhibit 38.6 kgf/mm$^2$ in tensile strength for as received, the nearly same value as that of Examples, the elongation is as small as 4.0%, and the change by heating is small as in Comparative Example 3. Consequently, the electrodeposited copper foils according to the present invention can be said to be superior in the surface roughness and the elongation.

Comparison of Examples and Comparative Example 5

Hereinafter, 12-micron meter electrodeposited copper foils will be compared between Examples and Comparative Example 5 referring to the data described in Table 5 and Table 6.

In comparing of the surface roughness (Rzjis) of a deposit side, the electrodeposited copper foils obtained in Examples show 0.30-micron meter to 0.41-micron meter, and the electrodeposited copper foil obtained in Comparative Example 5 shows 1.00-micron meter, whereby the difference is clear. While the gloss [Gs(60-deg.)] of the deposit side of the electrodeposited copper foil obtained in Comparative Example 5 is in the range of 324 to 383, if it is examined on [Gs(60-deg.] only, those of the electrodeposited copper foils obtained in Examples are in the absolutely different range of 603 to 759. Namely, the electrodeposited copper foils in Examples have deposit side which is smoother and closer to a mirror surface compared to the electrodeposited copper foil of Comparative Example 5. In comparison on the mechanical properties as received, electrodeposited copper foil of Comparative Example 5 shows 37.9 kgf/mm$^2$ in tensile strength and 8.0% in elongation, and the electrodeposited copper foil of Example 10 shows 35.5 kgf/mm$^2$ in tensile strength and 11.5% in elongation, which is slightly better in flexibility. In comparison on the mechanical properties, electrodeposited copper foil of Comparative Example 5 after 180° C.×60 min-heating shows 31.6 kgf/mm$^2$ in tensile strength and 7.5% in elongation, and the electrodeposited copper foil of Example 10 shows 33.2 kgf/mm$^2$ in tensile strength and 11.2% in elongation, whereby the electrodeposited copper foil according to the present invention is superior. From this result, in consideration of the thermal history when the electrodeposited copper foil is processed into a copper-clad laminate, for example, a flexible printed wiring board using the electrodeposited copper foil according to the present invention is anticipated to have an excellent flexibility, etc.

Then, the advantage in using three kinds of gloss as an index to measure the uniformity of surfaces is confirmed. When the difference of the gloss in common direction, for the MD of a deposit side of the 12-micron meter electrodeposited copper foil obtained in Examples are examined, [Gs (20-deg.)] is 824 to 1,206; [Gs(60-deg.)] is 649 to 759; and [Gs (85-deg.)] is 112 to 142, showing a higher value as the incident angle of the measuring light approaches perpendicular. By contrast, the evaluation result measured in the MD of the deposit side of the 12-micron meter electrodeposited copper foil obtained in Comparative Example 5 is examined, [Gs(20-deg.)] is 126; [Gs(60-deg.)] is 383; and [Gs(85-deg.)] is 117, showing the nearly same values at [Gs(20-deg.)] and [Gs(85-deg.)]. Therefore, the deposit side of the 12-micron meter electrodeposited copper foil obtained in Comparative Example 5 has some characteristic shape.

Then, a SEM photograph of the deposit side of the 12-micron meter electrodeposited copper foil obtained in Example 11 is shown in FIG. 1; and a SEM photograph of the deposit side of the 12-micron meter electrodeposited copper foil obtained in Comparative Example 5 is shown in FIG. 2. As is clear from FIG. 2, the deposit side of the electrodeposited copper foil obtained in Comparative Example 5 shows irregularities, though small, and moreover, irregular depositing parts, which could not be found without the large magnification observation, are found here and there. Namely, the diffused reflection of this irregular part makes the value of the gloss [Gs (20-deg.)] low and the surface roughness (Rzjis) high. In FIG. 1 which is a SEM photograph for the electrodeposited copper foil according to the present invention, no evident irregularities nor irregular depositing parts are not observed. Accordingly, the electrodeposited copper foil according to the present invention is superior in surface roughness and gloss.

When the surface-treated electrodeposited copper foils subjected to the roughening treatment are compared between Example 10 and Comparative Example 5, the increases in surface roughness (Rzjis) by the roughening treatment performed under the same condition are nearly equal, about 0.7-micron meter. As is clear from FIG. 2, this is presumed to be because since the irregularities observed in the deposit side shape of the electrodeposited copper foil obtained in Comparative Example 5 has a pitch of about 3-micron meter but is smooth, fine particles obtained by the roughening treatment put along their corresponding irregular shape. However, since the electrodeposited copper foil of Comparative Example 5 has a high surface roughness (Rzjis) of the deposit side to be the base, the surface roughness (Rzjis), which is a requirement of the present invention, of the bonding surface to an insulating layer-forming material cannot be made to be not more than 1.5-micron meter, thus clarifying the superiority of the electrodeposited copper foil according to the present invention.

Comparison of MPS and SPS: Although SPS was used in place of MPS in Example 9 to Example 14, the surface roughness (Rzjis) of a deposit side of the obtained 12-micron meter electrodeposited copper foils is 0.30-micron meter to 0.41-micron meter; and the gloss [Gs(60-deg.)] is 603 to 759, whereby use of SPS also is confirmed to have the same effect as MPS.

Now, although when the electrodeposited copper foils in above Examples according to the present invention were manufactured, favorable results were obtained in solution constitutions of sulfuric acid base copper electrolytic solutions in which the copper concentrations were about 40 g/l to 120 g/l, and the free sulfuric acid concentrations were about 60 g/l to 220 g/l, there is no trouble in shifting the concentration range according to applications of purposes. Further, the presence of additives other than the additives described in above Examples is not excluded, and they can rather be optionally added as long as they are confirmed to further enhance their effect and contribute to the quality stability in continuous production.

INDUSTRIAL APPLICABILITY

The deposit side of the electrodeposited copper foil according to the present invention has a lower profile than low-profile electrodeposited copper foils conventionally supplied in markets; the roughness of the deposit side is lower than that of the shiny side of the electrodeposited copper foil; and both the surfaces are together glossy smooth surfaces. The copper electrolytic solution used in manufacture of the electrodeposited copper foil has a large durability to deviations in manufacturing conditions and variations in thickness, and is superior in productivity. Accordingly, it is suitable for forming fine pitch circuits of tape automated bonding (TAB) boards and chip on film (COF) boards and further electromagnetic wave-shielding circuits of plasma display panels. Moreover, since the electrodeposited copper foil has excellent mechanical properties, it is suitable for use as current collecting materials constituting anodes of lithium ion secondary batteries, etc.

Figure 1:
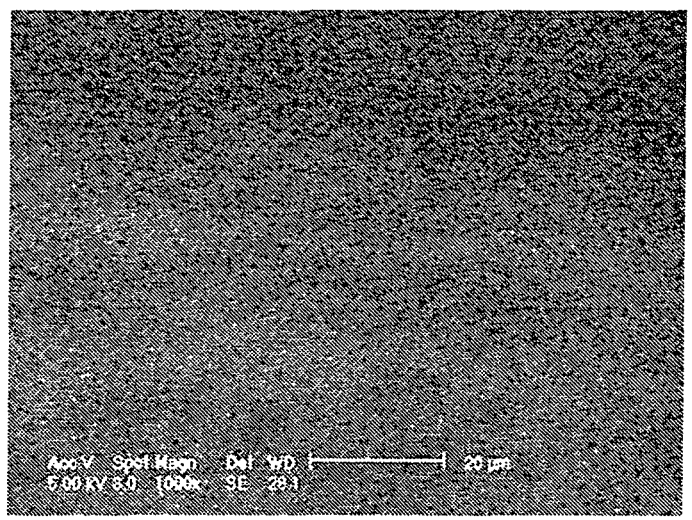
FIG. 1 is a SEM photograph of a deposit side of 12-micron meter thick electrodeposited copper foil obtained in Example 11.
Figure 2:
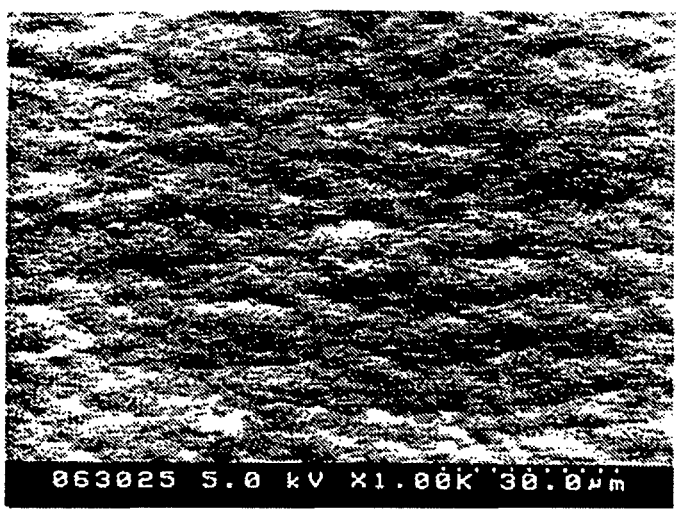
FIG. 2 is a SEM photograph of a deposit side of 12-micron meter thick electrodeposited copper foil obtained in Comparative Example 5.

What is claimed is:

1. An electrodeposited copper foil comprising:
   a deposit side;
   a shiny side;
   the deposit side having:
      a surface roughness (Rzjis) lower than 0.60-micron meter;
      a gloss [Gs(60-deg.)] not lower than 700; and
      a relationship wherein a gloss [Gs(20-deg.)] is greater than a gloss [Gs(60-deg.)], wherein the gloss [Gs(60-deg.)] of the deposit side has a ratio of a TD gloss measured in the transverse direction to an MD gloss measured in the machine direction [TD gloss/MD gloss] of between 0.9 and 1.1.

2. An electrodeposited copper foil having a deposit side and a shiny side, wherein the deposit side thereof has a surface roughness (Rzjis) lower than 1.0-micron meter, a gloss [Gs (60-deg.)] not lower than 400, and a relationship of a gloss [Gs(20-deg.)] >a gloss [Gs(60-deg.)], wherein the gloss [Gs (60-deg.)] of the deposit side has a ratio of a TD gloss measured in the transverse direction to an MD gloss measured in the machine direction [TD gloss/MD gloss] of between 0.9 and 1.1.

3. The electrodeposited copper foil according to claim 2, wherein a the shiny side thereof has a surface roughness (Rzjis) of lower than 2.0-micron meter, and a gloss [Gs(60-deg.)] of not lower than 70.

4. The electrodeposited copper foil according to claim 2, wherein the copper foil as received has a tensile strength of not less than 33 kgf/mm$^2$, and an elongation of not less than 5%.

5. The electrodeposited copper foil according to claim 2, wherein the copper foil after heating (180° C.×60 min, in the air) has a tensile strength of not less than 30 kgf/mm$^2$, and an elongation of not less than 8%.

6. A surface-treated electrodeposited copper foil, obtained by subjecting the deposit side surface or the shiny side surface of the electrodeposited copper foil according to claim 2 to at least one treatment selected from a rustproofing treatment and a silane coupling agent treatment.

7. The surface-treated electrodeposited copper foil according to claim 6, wherein a surface roughness (Rzjis) of the treated surface is not more than 1.5-micron meter.

8. The surface-treated electrodeposited copper foil according to claim 6, wherein a gloss [Gs(60-deg.)] of the treated surface is not lower than 250.

9. The surface-treated electrodeposited copper foil according to claim 6, wherein the treated surface is roughened.

10. The surface-treated electrodeposited copper foil according to claim 6, wherein the treated surface is the deposit side of the electrodeposited copper foil.

11. A copper-clad laminate, obtained by laminating the surface-treated electrodeposited copper foil according to claim 6 to an insulating layer-forming material.

12. The copper-clad laminate according to claim 11, wherein the insulating layer-forming material contains a skeletal material to form a rigid copper-clad laminate.

13. A rigid printed wiring board, obtain by using the rigid copper-clad laminate according to claim 12.

14. The copper-clad laminate according to claim 11, wherein the insulating layer-forming material is formed of a flexible material to form a flexible copper-clad laminate.

15. A flexible printed wiring board, obtained by using the flexible copper-clad laminate according to claim 14.

* * * * *